United States Patent [19]

Roch

[11] 3,936,743
[45] Feb. 3, 1976

[54] HIGH SPEED PRECISION CHUCK ASSEMBLY

[75] Inventor: Jacques L. Roch, San Jose, Calif.

[73] Assignee: Electroglas, Inc., Menlo Park, Calif.

[22] Filed: Mar. 5, 1974

[21] Appl. No.: 448,370

[52] U.S. Cl............... 324/158 F; 269/55; 324/72.5
[51] Int. Cl.².................... G01R 31/02; B23Q 1/14
[58] Field of Search........... 324/158 F, 158 P, 72.5; 269/55, 66

[56] References Cited
UNITED STATES PATENTS
3,810,017  5/1974  Wiesler et al. ................. 324/158 F OTHER PUBLICATIONS
DeGroodt et al., Mechanical Evaluation Machine; IBM Tech. Dis. Bull.; Jan. 1971, pp. 2298, 2299.

Primary Examiner—R. V. Rolinec
Assistant Examiner—Ernest F. Karlsen
Attorney, Agent, or Firm—Ellsworth R. Roston

[57] ABSTRACT

Testing of integrated circuit components of the silicon wafer type for grading purposes is accomplished by supporting the wafer matrix on a platform type work table which is indexed in an x-y coordinate fashion, with the work table being moved vertically to a test position such that the test probes make contact with a precise predetermined position corresponding to the precise location of that portion of the integrated circuit to be tested. The work table is movable vertically with reference to a predetermined axis and rotatable with respect thereto such that the surface of the table remains perpendicular to the reference axis. The chuck assembly for moving the table includes a housing having a bore whose center forms the axis, with a chuck plate mounted for sliding movement in the bore. The end of the chuck plate is in the form of a flanged spool which receives bearing-eccentric assembly for effecting vertical movement while permitting rotation of the spool and the attached chuck plate. A multiphase stepping motor is used to drive the chuck plate through the bearing-eccentric assembly, the motor including optical limit switches sensing the motor shaft position and controlling the motor operation. The motor has a sinusoidal speed characteristic and uniformly decelerates as the table reaches the predetermined reference position. A vacuum assembly is used to provide a pressure differential across the table, the chuck assembly being electrically grounded to prevent interference with testing of wafers. Also described is an angular orientation system by which the rotation of the table may be controlled.

10 Claims, 8 Drawing Figures

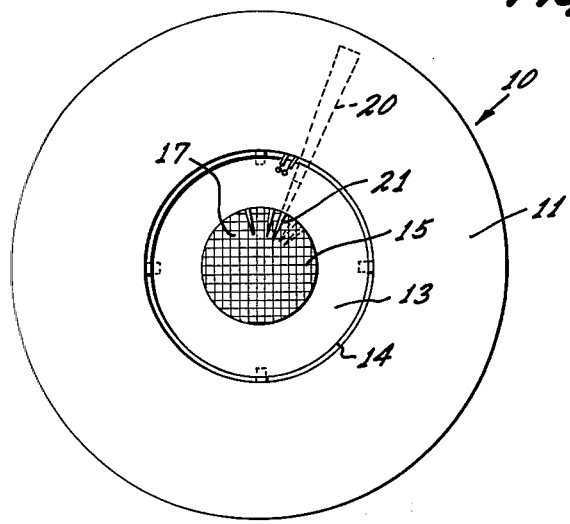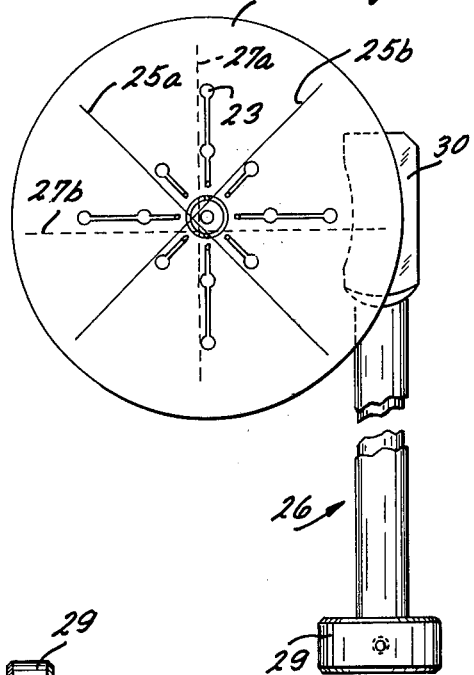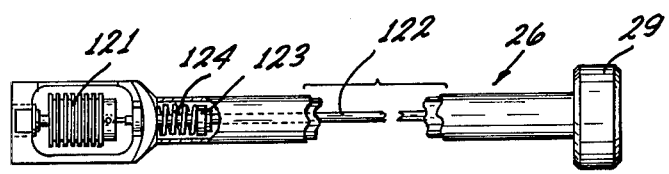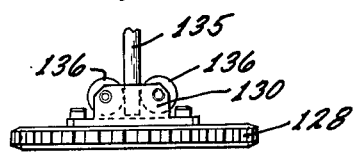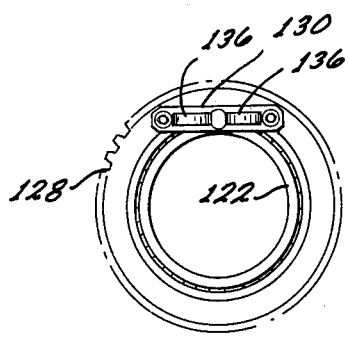

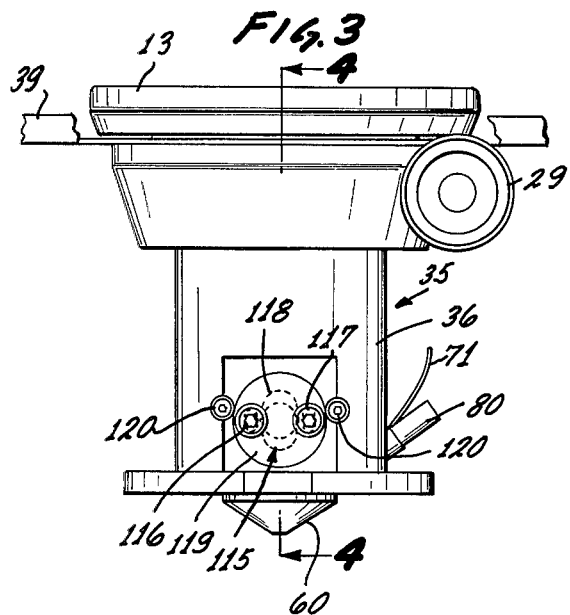
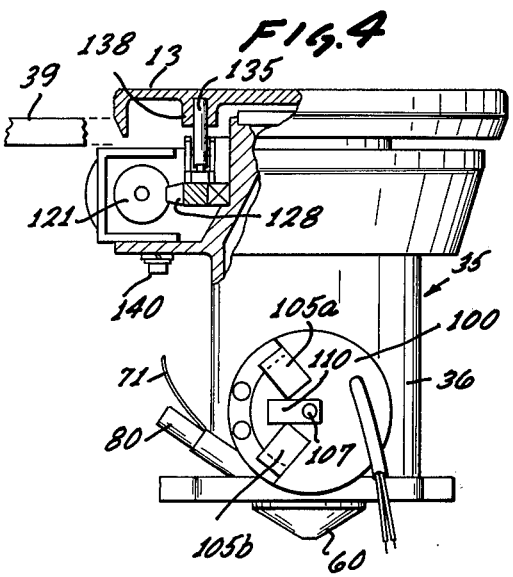
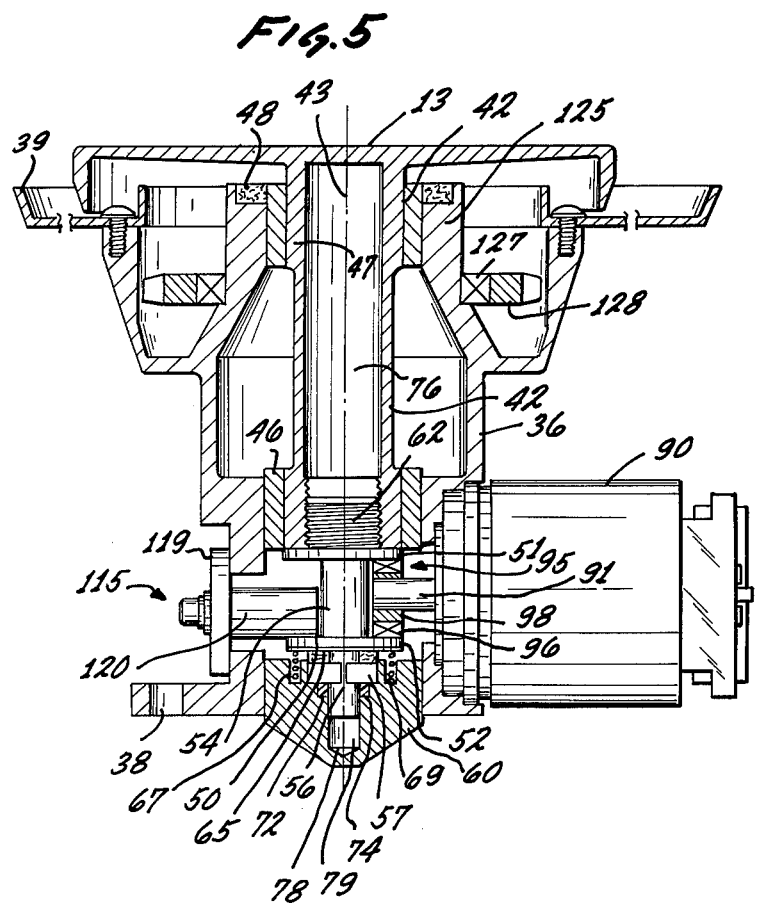

HIGH SPEED PRECISION CHUCK ASSEMBLY

BACKGROUND OF THE INVENTION

Systems are known for grading integrated circuit components in wafer form by testing the same and applying a grading mark thereto. Reference is made to U.S. applications 436,844; and 436,845, each filed Jan. 28, 1974 and assigned to the assignee of this application.

In the current art of electronic circuits, integrated circuits or micro-circuits are fabricated in such a manner that thin semiconductor slices having a multiplicity of individual matrices or micro-circuits are formed. In the usual practice in the art, the slices contain multiple identical repeating matrices of the same type of micro-circuit or integrated circuit unit. The individual unit is sometimes referred to as an integrated circuit chip.

The present practice is to test each of the circuits of each integrated circuit chip formed on the semiconductor wafer prior to separating the wafer into the desired individual integrated circuit components. In some instances, the individual integrated circuit unit may contain multiple circuits, and it is therefore desirable to test each of the circuits of the integrated circuit unit before the wafer is cut into individual integrated circuit units.

Since each micro-circuit of each wafer is normally in a predetermined precise relationship with respect to the adjacent circuit units, it is possible to test the circuitry if a probe can be accurately located on each preselected point corresponding to the circuit to be tested. It is possible, for example, to test several different circuits at the same time, or the same circuit of several different integrated circuit units.

Obviously, the positioning of the probes must be quite accurate and adjustable such that different integrated circuit units may be tested. Once the probes have been properly oriented, the wafer may be stepped from position to position so that each micro-circuit is properly located relative to the cooperative probe units for appropriate testing.

The orientation in a predetermined position may be defined as a precise location referenced by XY coordinates, and a vertical position defined by a Z coordinate. Since the wafer is generally planar, the proper vertical position of the probes used in testing must be closely controlled in order to obtain uniform contact pressure between each probe tip and each circuit.

The usual procedure involves placing the matrix on a work table which is movable vertically and rotatable. Normally the matrices are arranged such that the individual chips are disposed in a checkerboard pattern sometimes referred to as a "street and avenue" orientation. Accordingly it is necessary to rotate the matrix such that the streets and avenues are in the proper $x-y$ orientation since the testing and grading involves a stepping sequence from one position defined by an $x-y$ coordinate to another position defined by another $x-y$ coordinate such that the proper circuit component is accurately aligned in each successive coordinate position.

Thus, the operator examines the matrix by an optical means and rotates the work table to bring the streets and avenues of the matrix into the proper $x-y$ orientation. Thereafter, stepping from one $x-y$ position to the next is carried out by automatic control means well known in the art.

Once the matrix is properly oriented in the $x-y$ direction, the test probe arms are adjusted, as described in the above-identified applications, to position the tip thereof in the proper $x-y-z$ position for testing a particular circuit component of a specific chip. After orientation of the probe arm, the table and the matrix is raised vertically such that the tip of the test probe contacts the circuit and the circuit tested. Thereafter the circuit is graded and the sequence repeated, i.e., the matrix is moved downwardly, indexed to the next $x-y$ position and moved vertically such that the tip of the test arm contacts the next chip at the proper circuit being tested. In this manner the entire matrix is tested and graded. When a second identical matrix is placed on the platform all that need be done is to provide the proper $x-y$ orientation and the next matrix is ready for testing and grading.

The above procedure, as will be apparent, requires extremely accurate location and positive control of the positioning of the matrix and the chips making up the matrix. One of the difficulties of the prior art devices has been the vertical movement of the platform in that the vertical position thereof is quite important in an automatic testing sequence.

For example, if the table overtravels in moving upwards, either the probe arms or the matrix or both may be damaged. The result is improper testing and grading. Another problem which is encountered is what is termed "bouncing" in that the platform tends to hunt for the final vertical position. When this takes place, the probe arm may scratch the matrix causing damage to an otherwise usable circuit.

Finally some of the problems of prior devices stems from the fact that the vertical orientation of the platform in the raised position may vary for each vertical cycle of platform movement. When this takes place the contact pressure between the probe arm and the circuit varies from one test to another resulting in erronious test data and possible incorrect grading of acceptable circuit components.

It accordingly becomes apparent that a need exists for a chuck assembly which accurately positions a work platform in a precise vertical position and which can operate rapidly and effectively without any bouncing or hunting as the platform reaches the predetermined vertical position.

Additionally, there are advantages in providing such a chuck assembly in which the plane of the work table is maintained in a true perpendicular position regardless of the rotational orientation of the work table. In this way, the work platform is "square" with a reference axis.

It is also advantageous to provide a motor drive system which so controls movement of the platform as to prevent hunting and minimize bouncing while offering positive control of platform vertical position.

SUMMARY OF THE INVENTION

This invention relates to an improved chuck assembly for use in testing and grading integrated circuit components and more particularly to an improved high speed precision chuck assembly which permits rotation of a work platform while maintaining the same in a predetermined perpendicular relationship to a reference axis, and wherein the chuck assembly is driven by a motor in a controlled manner to a predetermined vertical position.

In accordance with the present invention, an improved chuck assembly is provided for use in a system for testing and grading integrated circuit components. In such a system, a wafer containing multiple circuit components is supported on a plaform which is indexed in an x–y coordinate manner and then moved vertically to a test position wherein one or more probe assemblies test preselected portions of the circuit components.

The chuck assembly, which forms the improvement in the above system, includes a platform or work table which supports the wafer, the platform being movable vertically along the predetermined reference axis between a lowered position and a predetermined upper position which constitutes the test position. The platform is supported within a housing which includes a bore, the center of the bore forming the predetermined reference axis as to which all other planes are referenced. Received within the bore is a vertically movable chuck having a spool arrangement at the lower end thereof, the chuck being rotatable within the bore as well as being movable axially within the bore.

A multiphase stepping motor having a sinusoidal speed charateristic is used as the principal power source, the shaft of the motor having affixed at one end thereof a bearing-eccentric arrangement which is received within the spool of the chuck. To the other end of the motor shaft there is affixed a shutter assembly which cooperates with optical limit switches, the latter being in predetermined orientation with the eccentric thereby providing information with respect to the position of the platform and controlling the operation of the motor stepping sequence as the platform approaches the predetermined vertical test position. In effect, the optical limit switches and the motor phase provide information indicating the position of the platform either in the raised or lower position. The motor assembly is of such a type that it gradually increases to a maximum speed and then uniformly decreases speed to a stop position. This type of motor assembly operation, in cooperation with the bearing-eccentric arrangement provides a chuck system which rapidly approaches the predetermined reference test position, uniformly decelerates by virtue of bearing-eccentric and comes to a stop without any hunting effecting the top reference position of the table.

Also included in the chuck assembly is an arrangement for rotating the work table in a precise controlled fashion for proper orientation of a matrix in the proper x–y coordinate relationship.

The chuck assembly also includes a system for electrically grounding the components thereof so as not to interfere with the electrical testing of the wafer, as well as a vacuum system for creating a pressure differential which maintains the wafer firmly positioned on the surface of the work table.

It will be apparent to those skilled in the art that the apparatus of the present invention is not to be considered to be limited to the specific constructions illustrated and described herein. Rather, the specific construction shown and described herein is illustrative of a preferred form of the present invention, and other embodiments and modifications will become apparent to those skilled in the art upon reading the following detailed description.

BRIEF DESCRIPTION OF THE DRAWINGS

FIG. 1 is a somewhat diagrammatic plan view of a platform and probe assemblies and a matrix on the platform, in accordance with the present invention;

FIG. 2 is a plan view showing the platform and the assembly for rotating the platform about the reference axis in accordance with the present invention;

FIG. 3 is a side view, in elevation, as seen from the bottom of FIG. 2 of the platform and chuck assembly in accordance with the present invention;

FIG. 4 is a view, partly in section and partly in elevation as seen from the top of FIG. 2 of the platform and chuck assembly in accordance with the present invention;

FIG. 5 is a view partly in section and partly in elevation taken along the line 5—5 of FIG. 3;

FIG. 6 is a view partly in section and partly in elevation for the rotational adjustment assembly in accordance with the present invention;

FIG. 7 is a view inside elevation of the gear assembly for use with the rotational assembly in accordance with the present invention; and FIG. 8 is a plan view of the gear assembly illustrated in FIG. 7.

DETAILED DESCRIPTION

Referring to the drawings which illustrate an exemplary form of a preferred embodiment of the present invention, FIG. 1 shows an assembly 10 for testing integrated circuit components. A support ring 11 is mounted vertically above a generally circular platform 13 the latter being positioned within the central opening 14 provided in the interior of the ring 11 as shown. Thus, the platform 13 whose orientation in a horizontal plane is accurately controlled, may be moved vertically without interference from the ring 11.

Platform 13 functions as a work table upon which may be mounted a wafer generally indicated 15, the latter formed with a grid pattern on its upper surface, that is, avenues and streets, the space between each grid, one of which is illustrated at 17, is provided with a micro-circuit of any desired type, formed by means well known in the art.

The work table 13 is normally moved in a direction parallel to the vertically oriented columns of the wafer and parallel to the horizontally oriented rows of the wafer in a step-by-step indexing movement which is precise and accurate. Thus, each of the integrated circuit components illustrated for example at 17, may be located in a predetermined relative position such that each micro-circuit may be brought into position beneath the test probes supported by the ring. After proper orientation in an x–y direction, the work table is moved vertically upwardly in order to bring the wafer in and out of vertical alignment with probe assemblies 20, one of or more of which may be arranged radially with respect to the platform and supported by the ring 11.

As illustrated, each test probe assembly includes a cooperating probe test unit 21 which makes contact with a predetermined selected component of the integrated circuit chip within a particular grid space.

Accordingly, it becomes apparent that precise, accurate control of the position of the platform with respect to the prealigned test probe assemblies is needed in order to make proper contact with the particular circuit being tested.

Referring to FIG. 2, the work table 13 includes a plurality of apertures 23 which form part of a vacuum system for holding the wafer in position on the surface of the table 13. By way of explanation, if it is assumed that a wafer is positioned such that the avenue and streets thereof are in the orientation indicated by the solid lines 25a and 25b, it becomes apparent that the work table must be turned to provide the proper x–y orientation for subsequent x–y indexing thereof. The rotational orientation of the work table is achieved through a theta rotating mechanism 26 whose function is to rotate the work table until the streets and avenues of the matrix are aligned in the relative position indicated as 27a and 27b.

The theta indexing mechanism basically includes a knob 29 which operates a gear positioned within the housing 30, the details of which will be described.

Referring to FIGS. 3–5, wherein like reference numerals have been used where applicable, the chuck assembly 35 for moving the work table 13 includes a housing 36 which is supported by a substage assembly, not shown. The housing is mounted on the substage assembly by three bolts which pass through bolt holes 38 located at 120° intervals around the lower portion of the housing. The bolts are used with insulating bushings in order to insulate electrically the housing from the substage assembly on which it is mounted. Bolted to the housing, as indicated, is a cover assembly 39 the latter acting as a pan for catching parts which may inadvertently be freed from the platform 13.

The housing 36 includes a bore 40 which receives a hollow stem section 42 formed integrally with the platform, the stem assembly 42 and platform being referred to as the chuck plate. The center axis 43 of the bore of the housing 36 forms the reference axis as to which all other parts are oriented. Thus, the center axis defines the position of the plane of the work table surface which must be maintained in perpendicular position with respective to the axis 43 in all rotational orientations of the work table.

Supporting the chuck plate within the bore are a pair of spaced bushings 46 and 47, the bushing being an oil filled sintered bronze bushing whose supply of oil is provided by an oil pad 48. The bronze bushings support the shaft 42 of the chuck plate such that there is little play in the rotational or axial movement of the shaft with respect to the housing.

Positioned in the lower portion of the bore 40 is a spool assembly generally designated 50, the spool assembly including an upper flange 51 and a spaced lower flange 52.

Located between the flanges 51 and 52 of the spool assembly 50 is a spool shaft 54, the flanges being formed integrally with the shaft, a portion of which 56 received within a bearing assembly 57 supported by a vacuum insert 60. The upper portion 62 of the shaft is affixed to the shaft of the chuck plate, as indicated.

Surrounding the lower portion 56 of the shaft 54 and disposed on the underside of flange 52 is a washer 65, preferably of electrically conductive material such as beryllium-copper and affixed to the spool assembly by an electrically conductive epoxy cement.

The vacuum insert 60 includes the generally annular cavity 67 concentrically disposed with respect to the lower portion 56 of the shaft, the cavity 67 receiving a spring element 69 which contacts the conductive washer 65 and which includes an output lead 71 for grounding the chuck plate. Received within a groove 72 in the vacuum insert is a seal element 74 which engages the lower portion of the shaft 56 in sealing relationship therewith. Oil pads 75 are supported by the bearing 57 to supply oil for lubrication.

The shaft 54 of the spool assembly 50 is hollow on the interior and communicates with a chamber 76 formed in the interior of the chuck plate shaft, the latter communicating with the vacuum passages formed in the table 13 for providing a pressure differential which operates to hold a matrix in position on the platform 13.

As shown in FIG. 5, the lower end 56 of the shaft terminates short of the bottom 78 of the bore formed in the vacuum insert, to form a small chamber 79 therein, a vacuum hose 80 (FIGS. 3 and 4) being mounted in communication with the chambers 79 for the purpose of drawing a vacuum through the chamber 79, through the hollow portion of the shaft 54, and chamber 76 to the vacuum passages formed in the work platform 13, as described.

Mounted on one side of the housing is an optical motor assembly generally indicated 90, the latter being of the multiphase stepping variety having a speed characteristic which brings about sinusoidal vertical speed in movement of the chuck assembly. Attached to one end 91 of the motor shaft is a bearing-eccentric assembly 95 received within the spaced flanges 51 and 52 of the spool assembly 50. The bearing-eccentric assembly 95 includes a bearing element 96 in contact with each of the upper and lower flanges of the spool assembly, the bearing being a circular shielded ball bearing. Received within the circular bearing and affixed to the end 91 of the motor shaft is an eccentric member 98, the latter free to rotate within the bearing but affixed securely to the shaft.

Mounted to the end wall 100 of the motor 90 are a pair of optical limit switches 105a and 105b, the end 107 of the motor shaft carrying a shutter element 110 (FIG. 4).

As seen in FIG. 4, optical limit switches 105a and 105b are disposed in an angular orientation related to the amount of rotation of the motor shaft and thus the position of the eccentric and the vertical position of the platform. Thus, the position of the optical limit switch 105a represents the upper vertical position of the chuck plate assembly, while the position of optical limit switch 105b represents the lower vertical position of the chuck plate assembly. As the shaft rotates to effect vertical movement of the chuck plate assembly, the shutter 110 which is securely fastened to the shaft, rotates with the shaft between the optical switches 105b and 105a.

In the form illustrated in FIGS. 3–5, the motor shaft turns approximately 90°, thereby effecting movement of the chuck plate assembly from a lowered position to a raised position, or from a raised position to a lowered position depending upon the direction of rotation of the motor shaft. As the motor rotates the shaft, the eccentric 98 rotates bringing about vertical movement of the spool assembly along the reference axis through the bearing 96.

Also mounted on the housing 36, generally opposite the motor assembly 90 is a travel-stop assembly generally indicated 115. As shown in FIGS. 3 and 5, the travel stop 115 is mounted on the housing 36 by 2 bolts 116 and 117, the housing being provided with an oblong aperture 118, the stop plate 119 having oblong apertures therein through which the bolts 116 and 117 pass. Extending inwardly from the plate 119 is a stop element 120, the stop element bearing against the lower flange 52 of the spool assembly when the spool assembly is in the fully raised vertical position. The relative position of the stop member 120 is adjusted at the factory, the travel stop operating to preload the spool assembly which in turn feeds back through the bearing-eccentric assembly into the motor shaft in order to eliminate the radial play in the ball bearings of the bearing element 96 and to function as a back lash preventing system. Additionally, the travel stop also prevents the work platform 13 from rising vertically above the preselected reference plane and assists in preventing the work table from overshooting and then coming back down vertically, a type of jumping or bouncing which is sought to be avoided by the present invention. Bolts 120 extend through the housing to secure the motor 90 thereto.

As mentioned earlier, the motor 90 is a four phase stepping motor, driven with two phases at a time in order to provide high torque. The total rotation of the motor shaft is approximately 90°, and the motor is driven through six steps, although the speed thereof is synchronous in character. Accordingly, assuming a two phase operation, the phases would be AB, BC, ACD, DA, AB, BC, CD, that sequence of phasing defining the six steps of motor operation to bring the chuck plate from one position to another, and in the sequence above described it is the chuck plate being raised from the lower to the fully raised position.

Thus, optical limit switch 105b is so positioned on the end of the motor that with the chuck plate in the full down position, shutter 110 is beneath the optical switch 105b, and the motor has started the phase relationship AB. As the motor continues through its phased relationship, BC, CD, DA, AB, the motor shaft rotates carrying the shutter 107 to the leading edge of optical limit switch 105a. As the motor reaches step six, between the BC, CD phases, the shutter approaches the optical limit switch 105a, indicating to the motor control circuitry that the full vertical position of the chuck plate in the upper vertical reference position has been reached. Thus, the motor control circuitry by virtue of knowing the phases involved in motor operation and the position of the motor shaft accurately controls stopping of motor operation as the platform reaches the preselected vertical position. As was mentioned previously, the speed characteristic of the motor is synchronous in nature, and therefore, as the chuck plate approaches the upper vertical position the speed of the chuck plate is uniformly decreased and finally stopped at the sixth step of motor operation.

The motor operation is such that its speed gradually increases to a maximum and then maintains its speed until it stops. Such a motor operation in cooperation with the bearing-eccentric arrangement assures that the chuck plate is moved vertically in a rapid fashion but decelerating in a sinusoidal manner while reaching the upper position. By way of example 90° movement of the motor shaft operates to move the chuck plate assembly approximately 17 mils in vertical direction. Accordingly, it will be appreciated that the control of the motion of the chuck plate must be accurate in order to position the platform in the proper vertical reference plane.

By way of additional explanation of the operation of the improved chuck assembly of the present invention, it will be appreciated that the use of a roller bearing and spool assembly permits rotation of the table continuously a full 360°. Regardless of the orientation of the work table, the bearing-eccentric is always in a position to drive the spool in a vertical direction and all play of the chuck assembly is eliminated by controlling the tolerances and preloading the components through the use of the stop-travel assembly which bears against the lower flange of the spool as the spool is in the upper position.

Vertical downward movement of the chuck plate assembly is essentially the reverse operation of that described.

One of the features of the present invention relates to the controlled rotation of the platform and the chuck plate to a proper x–y orientation.

Referring to FIG. 6, the theta rotation assembly 26 includes a housing 117 having the knob 29 mounted at one end thereof, and a worm gear 121 positioned with the housing and supported on bearings as shown. Extending between the worm gear 121 and the knob is a shaft 122 supported by a bearing 123 which is preloaded by spring 124 to avoid backlash in the operation. By rotating the knob 29, the worm gear 121 is rotated.

Referring to FIG. 5, the housing 36 includes an inner core member 125 on which is formed a shoulder 126. Received in the shoulder is a circular bearing 127 and a gear member 128 supported by the bearing 127. The bearing 126 and gear 128 are concentric with the axis of rotation of the chuck plate.

Referring to FIGS. 7 and 8, the external gear ring 128 which is radially outwardly of the bearing 127 supports a pin bearing assembly 130 which forms a driving connection between the gear ring and the chuck plate. The pin element 135 is illustrated in FIG. 4.

As illustrated in FIGS. 7 and 8, the pin 135 is supported between elements 136, the pin being designed so as to preload the bearing, the solid end of the pin being received within an opening 138 formed on the underside of the table as illustrated in FIG. 4. Thus, as the knob 29 of the theta rotational adjustment assembly is turned, the worm gear is turned to rotate the gear ring 28 thereby carrying with it the chuck plate assembly and platform, the theta rotating gear assembly being fixedly mounted to the housing by a bolt 140, as illustrated in FIG. 4.

As is apparent from the foregoing description of the exemplary form of this invention, an improved chuck assembly has been provided which is accurate in its movement without the bouncing or hunting sometimes a factor in the operation of prior art devices, especially those operated by solenoids. Such solenoid devices tend to bounce for a few milliseconds as the platform reaches the vertical raised position. By this invention precise, accurate control of table movement is achieved by the use of a bearing-eccentric driving mechanism whose operation is controlled by a high torque motor eccentric assembly having a sinusoidal speed characteristic and driven in six steps using two phases of the four phase motor.

The movement of the chuck assembly is fast and true with respect to the predetermined reference axis. Moreover, the provisions of a rotatable chuck assembly, positionable by the theta rotational control assembly is significant in that the plane of the table is maintained perpendicular to the reference axis regardless of the rotational orientation of the table. Vertical movement of the table by the improved chuck assembly and motor drive is precise along the reference axis, regardless of the rotational position of the table. It is for this reason that the spool assembly is employed in cooperation with the bearing-eccentric assembly.

The simple construction provides a simple reliable assembly which may be easily grounded electrically and simplifies the pressure differential generating means for holding a wafer on the work table. It will be appreciated that the chuck assembly travel may be varied from that described, e.g., 34 mils which would use 12 steps and a shaft rotation of 180° in each direction. Thus, the optical limit switches are positioned properly to sense the position of the shaft.

In the system described, the chuck assembly moves between vertical positions in 10 milliseconds or less, in each direction. This short time period and the accuracy of motion without hunting or bouncing at or near the raised position are significant, practical advantages.

It will be apparent to those skilled in the art that although an exemplary form of the present invention has been illustrated and described, many changes, modifications and substitutions may be made by one having ordinary skill in the art without departing from the spirit and scope of this invention.

I claim:

1. In a system for testing and grading integrated circuit components wherein a wafer containing multiple circuit components is supported on a platform which is indexed in an X-Y coordinate and then moved vertically to a test position wherein one or more probe assemblies test preselected portions of the circuit components, the improvement comprising;
    platform means for supporting a wafer and movable vertically along a predetermined reference axis between a predetermined upper and lower position,
    means supporting said platform for rotation about said reference axis while maintaining said platform perpendicular to said reference axis,
    means including spool means at one end thereof mounting said platform for said vertical movement,
    eccentric means cooperating with said spool means for effecting said vertical movement of said mounting means,
    motor means driving said eccentric means, and
    said motor means cooperating with said eccentric to provide a sinusoidal speed characteristic to said platform after reaching a maximum speed and decelerating said platform sinusoidally as said platform approaches said predetermined upper position.

2. In a system as set forth in claim 1 further including optical limit switch means cooperating with said motor means for indicating the relative position of said platform means and for controlling said motor operation.

3. In a system as set forth in claim 1 further including means cooperating with said platform for providing a pressure differential for holding a wafer on said platform.

4. In a system as set forth in claim 1 wherein said supporting means includes means for effecting controlled rotation of said platform about said reference axis.

5. In a system as set forth in claim 1 wherein said motor is a multiphase stepping motor, said system further including optical limit switch means cooperating with said motor means and operative to de-energize said motor as said platform reaches said predetermined position.

6. In a system as set forth in claim 1 wherein said spool means includes spaced flanges,
    said eccentric means including bearing means received between said spaced flanges and forming a bearing surface for rotation of said spool means,
    said bearing means receiving an eccentric,
    said motor including an output shaft connected to drive said eccentric in a first direction for raising said platform and in a second direction for lowering said platform.

7. In a system as set forth in claim 6 further including optical limit switch means cooperating with said motor means,
    shutter means connected to said shaft and in predetermined orientation with said eccentric and cooperating with said optical limit switch means for indicating the angular position of said motor shaft and thus the relative position of said platform.

8. In a system as set forth in claim 7 wherein said motor is a multiphase stepping motor, and
    said optical limit switch means being operative in response to the particular phase of said motor operation to control the stopping thereof.

9. In a system as set forth in claim 4 wherein
    said means for effecting controlled rotation of said platform includes
    means mounted on said support means for effecting rotation thereof about said reference axis,
    said last named means including gear means supported for rotation below said platform and means interconnecting said gear means with said platform, and
    means to effect rotation of said gear means.

10. In a system as set forth in claim 1 further including means to ground said platform electrically.

* * * * *